United States Patent [19]

Sauerland

[11] Patent Number: 4,725,771
[45] Date of Patent: Feb. 16, 1988

[54] METHOD AND APPARATUS FOR FREQUENCY ADJUSTMENT OF MONOLITHIC CRYSTAL FILTERS

[76] Inventor: Franz L. Sauerland, 2851 Southington Rd., Shaker Heights, Ohio 44120

[21] Appl. No.: 801,295

[22] Filed: Nov. 25, 1985

[51] Int. Cl.$^4$ .................................. G01R 29/22
[52] U.S. Cl. .................................. 324/56; 324/81
[58] Field of Search ............ 324/56, 57 Q, 57 SS, 324/80, 81; 427/8, 10, 100; 29/25, 35

[56] References Cited

U.S. PATENT DOCUMENTS 3,963,982 6/1976 Roberts .................................. 324/56
4,642,505 2/1987 Arvanitis .................................. 29/25.35 X Primary Examiner—Reinhard J. Eisenzopf
Assistant Examiner—Jack B. Harvey

[57] ABSTRACT

Method for fine tuning center frequency and bandwidth of a monolithic crystal filter by means of adjusting its two resonator frequencies and its symmetric frequency to predetermined values. The three frequencies are preferably measured in a network that provides two balanced signals and is able to apply them alternately (for the measurement of the two resonator frequencies) and simultaneously (for the measurement of the symmetric frequency) to the two filter ports. The frequencies are adjusted by changing the mass distribution on the crystal wafer in sequential steps.

4 Claims, 7 Drawing Figures

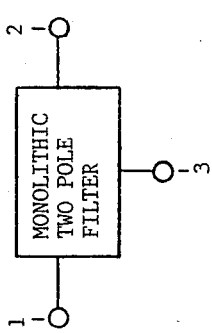
FIGURE 3 PRIOR ART
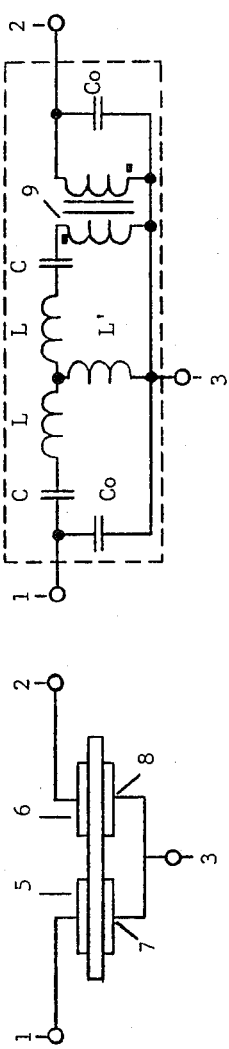
FIGURE 2 PRIOR ART
FIGURE 1 PRIOR ART
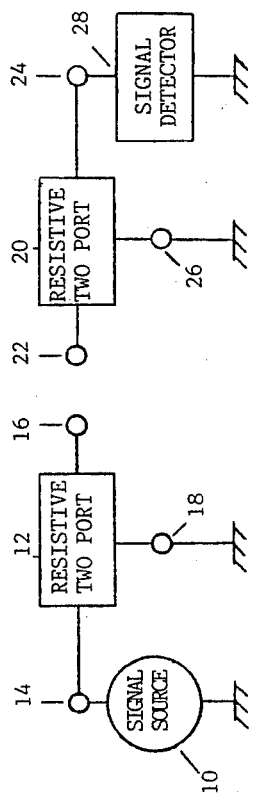
FIGURE 4 PRIOR ART

METHOD AND APPARATUS FOR FREQUENCY ADJUSTMENT OF MONOLITHIC CRYSTAL FILTERS

BACKGROUND

A monolithic twopole crystal filter comprises two acoustically coupled resonators on one crystal wafer. The resonators are formed by two pairs of opposite electrodes, separated by a gap on at least one side of the wafer. Fine tuning the filter usually entails adjusting the center frequency and, preferably, also the bandwidth of the filter. The center frequency is determined by the two resonator frequencies, which can be adjusted by changing the mass of the electrodes. The bandwidth is determined by the inter-resonator coupling and can be adjusted by changing the mass distribution over the area covered by the electrodes and the inter-electrode gap. For example, the bandwidth can be increased by depositing additional mass in the gap or its vicinity, such as the electrode edges adjacent to the gap. If the filter has only one gap, the bandwidth can also be increased by increasing the mass opposite the gap on the wafer side opposing the gap. Alternately, the bandwidth can be decreased by subtracting mass in the described areas or by adding mass to the electrode edges furthest removed from the gap. Changing the mass can be achieved by various means, such as mass addition by vacuum deposition or chemical action, and mass removal by laser.

In the following, several conventional Methods for fine tuning of monolithic crystal filters are described. They are all based on adjusting some of the characteristic series resonance frequencies of the twopole, which are defined as follows: an upper and lower short circuit frequency for each side of the twopole, each measured with the opposite side short circuited; an upper and lower open circuit frequency for each side of the twopole, each measured with the opposite side open circuited; a resonator frequency for each side of the twopole, each measured with the opposite side's static capacitance neutralized. These definitions will become more apparent by reference to the twopole equivalent circuit, which is explained farther below. If the twopole is symmetric, each characteristic frequency of one side equals the corresponding one on the other side.

Method 1 is based on U.S. Pat. No. 4,343,827, which pertains to fine tuning by using a transmission method for visually displaying and adjusting the short circuit amplitude response versus frequency. First, the resonator frequencies are equalized by balancing the amplitude peaks at the two short circuit frequencies by means of adding mass to the electrodes. Then, both resonator frequencies, which are located midway between the two short circuit frequencies, are lowered to target by further mass addition. The method does not allow adjustment of bandwidth.

Method 2 is based on Method 1 but includes fine tuning of the bandwidth, which is defined as the difference between the two short circuit frequencies and is adjusted by changing mass at the electrode gap or the electrode edges.

Methods 1 and 2 require both frequency and amplitude adjustment and have limited accuracy because they depend on judging frequencies from a visually displayed curve.

Method 3 is used in commercial equipment such as the "Twopole Plating System" by Transat Corp. It is based on oscillator measurement of the two resonator frequencies and the bandwidth, the latter being measured by a network that uses two oscillators for simultaneous oscillation at the upper and lower short circuit frequencies and subsequent mixing and filtering of these frequencies to monitor the bandwidth.

Method 4 is based on U.S. Pat. No. 4,093,914, which describes a "Method of Measuring Parameters of a Crystal Filter" by means of measuring the two short circuit and two open circuit frequencies for one side of a twopole and then calculating the two resonator frequencies and the bandwidth. The method is attractive because of its simple measurement but is apt to have increasing accuracy limitations toward higher frequencies because of (a) the complex relationship between the measured and targeted frequencies, (b) the effect of the stray reactance of the measurement network on accuracy, (c) the heightened requirement for accuracy for the equivalent circuit, caused by the measurement from only one filter side.

Both Methods 3 and 4 depend on adjusting four frequencies during the tuning process.

In Methods 1-4 the main means of changing frequency is by way of metal deposition in vacuum, also called "plating". The deposition may be on one side or both sides of the filter wafer, and the selective mass distribution may be accomplished by one or more evaporation sources in conjunction with stationary or movable masking.

In any fine tuning approach the method of measurement is of critical importance, especially with regard to accuracy toward higher frequencies. The main applicable methods are based on oscillator, transmission, or reflection measurements. At present the operating frequency of most mass produced monolithic filters lies below 60 MHz, where oscillator measurement is adequate. As frequency increases further, the transmission or reflection methods are preferable, but they can encounter increasing accuracy limitations as the filter reactances approach the magnitude of the stray reactances of the measurement network. There is a strong need for higher frequency filters (up to at least 200 MHz), yet there appears to be no suitable commercial method available for efficient and accurate fine tuning of both center frequency and bandwidth. The present invention stems from the search for such a method and is based on two main objectives:

1. Find a wide band fine tuning method based on monitoring and adjusting only three frequencies instead of the four frequencies of prior art methods.
2. Find a measurement method which has minimum sensitivity to the effect of external stray reactances on the twopole measurement.

SUMMARY OF THE INVENTION

The invention covers a method for fine tuning center frequency and bandwidth of a monolithic crystal filter and comprises the steps of (a) selectively applying a signal to the two filter ports of the crystal filter for exciting each of three of its characteristic frequencies, (b) monitoring each excited characteristic frequency, (c) selectively adjusting the mass distribution of the crystal filter during the monitoring step such that the characteristic frequencies are adjusted substantially to preselected values.

A set of suitable characteristic frequencies are the two resonator frequencies and the summetric frequency. The two resonator frequencies correspond to the center frequency, and the symmetric frequency is directly related to the bandwidth.

The three characteristic frequencies are preferably measured in a network that provides two balanced signals and is able to apply them alternately (for the measurement of the two resonator frequencies) and simultaneously (for the measurement of the symmetric frequency) to the two filter ports. The filter can be adjusted in sequential steps such as: first, adjust the two resonator frequencies toward target while adjusting their difference to its predetermined value (zero for a symmetric filter); second, adjust the symmetric frequency and thereby the bandwidth toward target. If necessary the steps can be repeated until the targets are reached.

The main means for adjusting the resonator frequencies is change of mass on the resonator electrodes. The main means for adjusting the symmetric frequency is change of mass in or opposite to the inter-electrode gap or on the electrode edges parallel to the gap.

The approach is strictly valid for symmetric filters but can also be applied to unsymmetric filters.

A primary advantage of the invention is that it allows accurate fine tuning of both center frequency and bandwidth on monolithic filters over a wide band of frequencies.

Secondary advantages of the invention are the simplicity of the method and circuit used to measure and monitor the frequencies, and the relative insensitivity of the measurement accuracy to the effect of stray reactances external to the filter.

BRIEF DESCRIPTION OF THE DRAWINGS

For a better understanding of the invention, reference is made to the following description taken in connection with the accompanying drawings, and its scope is pointed out in the appended claims.

FIG. 1 shows a simplified schematic cross-sectional view of a twopole monolithic crystal filter with a crystal wafer, two sets of electrodes, and three electrical terminals.

FIG. 2 shows the simplified lossless equivalent circuit of a symmetric monolithic twopole filter with inductive and capacitive circuit parameters and three electrical terminals.

FIG. 3 shows a simplified schematic view of a monolithic twopole filter with three electrical terminals.

FIG. 4 shows a schematic view of a transmission measurement circuit with a signal source, signal detector, and a transmission network with two test terminals for connection to the device to be measured.

FIGS. 1-4 refer to prior art.

DESCRIPTION OF THE INVENTION

Figure 5:
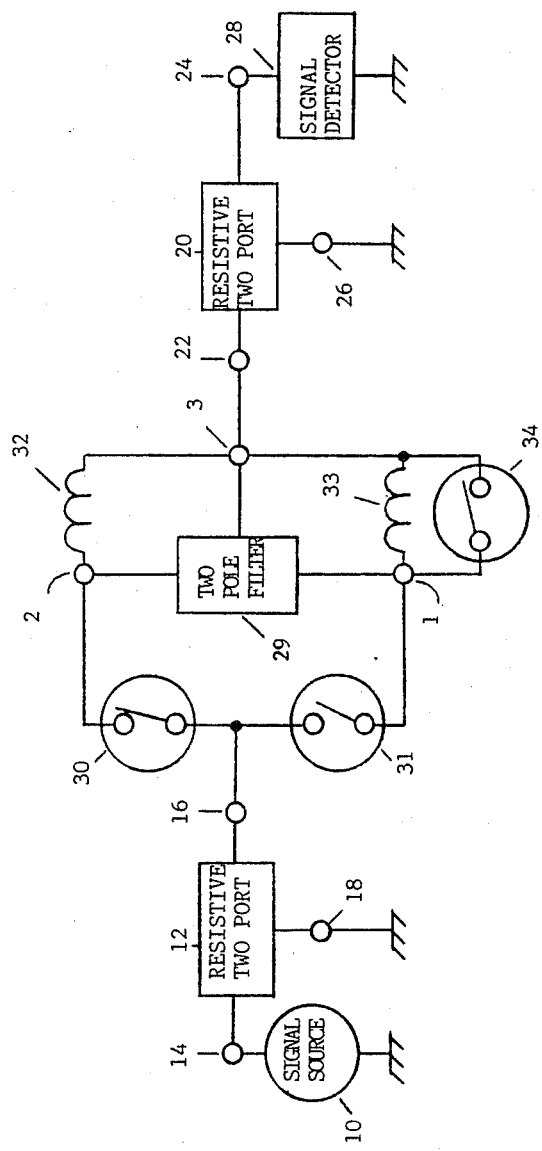
FIG. 5 shows a schematic view of a transmission measurement circuit according to FIG. 4 which has connected to its two test terminals a monolithic twopole filter, two neutralizing inductors, and two switches.

The description is based on some further explanation of prior art, together with the prior art FIGS. 1-5.

FIG. 1 shows a schematic cross-sectional view of a twopole filter with two ports 1 and 2, a common connection 3, a crystal wafer 4, and four electrodes 5, 6, 7, 8. Electrodes 7 and 8 are connected together and are sometimes formed as a single electrode that covers the gap between the electrodes. Electrode pairs 5-7 and 6-8 form resonators that are coupled together acoustically.

FIG. 2 shows the approximate lossless equivalent circuit of a symmetric twopole filter with the three terminals according to FIG. 1 and two types L and L' of inductors, two types C and Co of capacitors, and a 1:(−1) transformer 9. The Co are the static resonator capacitors, L and C are the motional parameters of the decoupled resonators, and L' is the coupling inductor. A simplified schematic representation of the filter is shown in FIG. 3 for use in subsequent figures.

The circuit of FIG. 2 has the following characteristic series resonance frequencies:

$$F1 = F2 = \tfrac{1}{2}\pi \sqrt{(L + L')C} \quad (1)$$

$$Fa = \tfrac{1}{2}\pi \sqrt{LC} \quad (2)$$

$$Fs = \tfrac{1}{2}\pi \sqrt{(L + 2L')C} \quad (3)$$

F1 and F2 are the resonator frequencies, and Fa and Fs are normally called the antisymmetric and symmetric frequencies, respectively. The center frequency equals the two resonator frequencies F1 and F2. The bandwidth is defined as $$Bw = Fa - Fs \quad (4)$$

Fa and Fs are the upper and lower short circuit frequencies, respectively, that can be measured at one filter port with the opposite port short circuited.

It can be shown that Fs is also the series resonance frequency that would be measured between terminals 1 and 3 if terminals 1 and 2 are connected together. All four frequencies depend on L, and all except Fa depend on L'. Fa is redundant in that it is determined by the choice for F1, F2, Fs. Together with the capacitance Co and C—which are fixed by the electrode size—these three frequencies determine the parameters of FIG. 1 completely, i.e. the filter can be fine tuned by adjusting only these three frequencies to predetermined values. This finding meets objective 1 mentioned in the BACKGROUND description and is an important part of the invention.

The three-frequency approach applies strictly to symmetric filters, but it can be used for unsymmetric filters. In unsymmetric filters there is usually a small difference between the two resonator frequencies, and the symmetric frequency is not exactly determined by equation 3. However, most unsymmetric filters can be approximately and adequately defined and adjusted by means of the two resonator frequencies and the symmetric frequency.

The frequencies can be adjusted via the inductances L and L'. L is mainly changed by changing the mass on the resonator electrodes, and L' is mainly changed by changing the mass on the inter-electrode gap. In practice there is some interdependence between L and L' due to either mass change.

According to equation 4, the bandwidth can be adjusted by adjusting Fs via L'. This and the fact that equation (3) requires F1=F2 suggests the following tuning steps when using vacuum deposition: (1) equalize the frequencies F1 and F2 and adjust them to a frequency above target by changing L through alternate and if necessary successive plating on the two resonator electrodes; (2) adjust Fs to a frequency above target. This is preferably done by plating a narrow strip on the inter-electrode gap on one or both sides of the wafer. (3) Repeat steps 1 and 2 until F1, F2 and Fs are at target.

The three frequencies can be monitored by two-terminal measurements using conventional transmission or reflection methods. FIG. 4 shows a suitable conventional transmission network consisting of an inline connection of a signal source 10, a resistive twoport network 12 with two ports 14 and 16 and a common ground connection 18, another resistive twoport network 20 with two ports 22 and 24 and a common ground connection 26, and a signal detector 28. Frequently used but not shown in this and subsequent figures is a reference channel connection between the signal source and the detector.

Networks 12 and 20 constitute a transmission network whose internal terminals 16 and 22 are to be connected to the two-terminal element to be measured. In the present case, these terminals can be connected by sequential switching to the three different two-terminal combinations needed to measure F1, F2 and Fs of the twopole. According to FIG. 1 and the previous definitions for F1, F2 and Fs these combinations are 1-3 (with terminals 2 and 3 terminated with an inductor to neutralize Co) for F1; 2-3 (with terminals 1 and 3 terminated with a neutralizing inductor) for F2, and 1-3 (with terminals 1 and 2 shorted) for Fs. The most frequently used transmission network for crystal measurements is the socalled Pi network, which is standardized according to the International Electrotechnical Commission's (IEC) Document No. 444 and was used for our evaluation.

FIG. 5 shows one of several circuits that can be used for the sequential measurement of F1, F2, Fs. The figure is based on the signal source 10, detector 28, and the twoport networks 12 and 20 of FIG. 4. The two ports 1 and 2 of the twopole 29 are terminated with two neutralizing inductors 32 and 33. The twopole's common terminal 3 is connected to terminal 22, and its two opposite ports 1 and 2 are alternately connectable to terminal 16 via switches 30 and 31 in order to allow measurement of F1 and F2. Another switch 34 is connected between port 1 and terminal 3 in order to allow measurement of Fs.

If the filter is symmetric, Fs can also be measured by simultaneously closing switches 30 and 31 and eliminating switch 34.

Experiments with 90 MHz twopoles show that the circuit per FIG. 5, which is based on the conventional transmission circuit of FIG. 4, has limitations with regard to accuracy and convenience of twopole measurements at high frequencies. This is largely due to the stray capacitances of switches 30 and 31, which produce a direct capacitive coupling between the two filter ports and thereby cause undesired side effects, such as measurements inaccuracies and high sensitivity to any impedance imbalance between the two filter ports.

There are ways of minimizing the switch capacitances, for example by using beam lead pin diodes switches. However, this approach is more complex and can cause other measurement distortions, such as those due to physical limitations for the RF filtering components for the biasing sources. Other means have also been evaluated, such as neutralizition of stray capacitances and modification of the switching arrangements and of the twoport networks. However, none of these approaches proved as effective and simple as that of FIG. 6.

Figure 6:
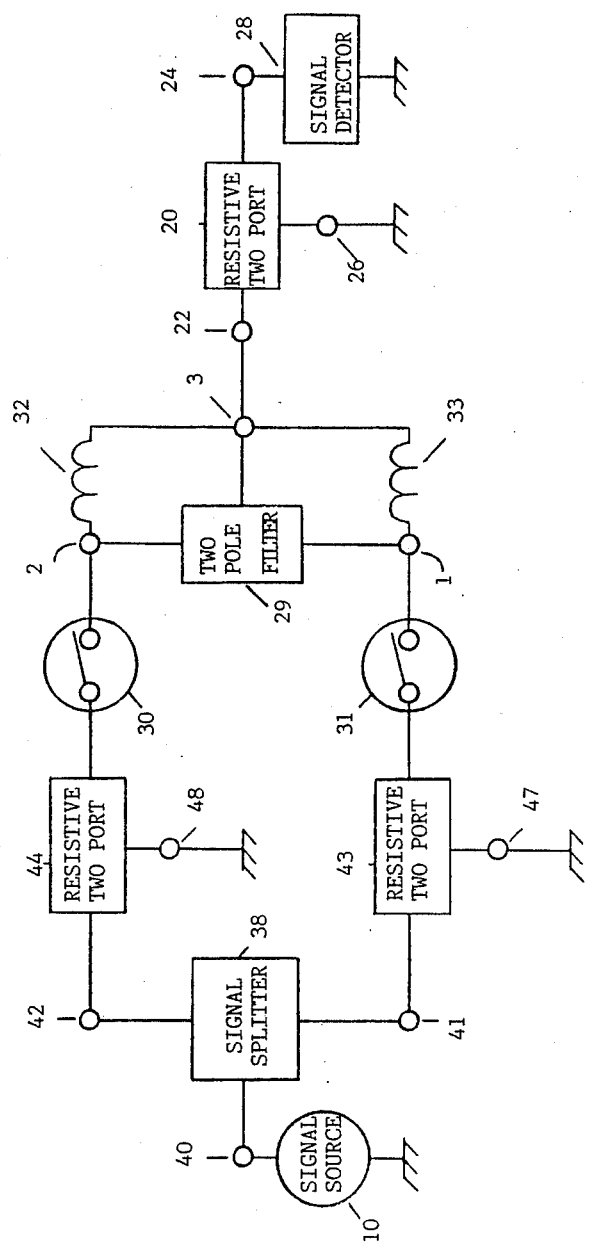
FIG. 6 shows a schematic view of a transmission measurement circuit according to the invention, with a monolithic twopole filter and its neutralizing inductors connected in a balanced transmission network.

FIG. 6 shows a twopole filter 29 with terminals 1, 2, 3 and neutralizing inductor 32 and 33 connected in a transmission network. The circuit includes some elements of the circuit of FIG. 5, such as a signal source 10, a resistive twoport network 20 with terminals 22, 24 and 26, switches 30 and 31, and a detector 28. In addition, it comprises a zero-degree signal splitter 38 with an input terminal 40 connected to the signal source and two output terminals 41 and 42 applying a balanced signal each to the identical resistive twoport networks 43 and 44, which in turn are connectable to the two filter ports 1 and 2 vis switches 30 and 31. The circuit allows the measurement of the resonator frequencies F1 and F2 by means of alternate closing of switches 30 and 31, and the measurement of Fs through simultaneous closing of switches 30 and 31. The stray capacitances of switches 30 and 31 are effectively isolated from each other by the resistive networks 44 and 43 and the signal splitter 38, such that there is no external capacitive coupling between the two filter ports. Hence, the use of balanced signals according to FIG. 6 meets objective 2 mentioned in the BACKGROUND description and is another important part of the invention.

Figure 7:
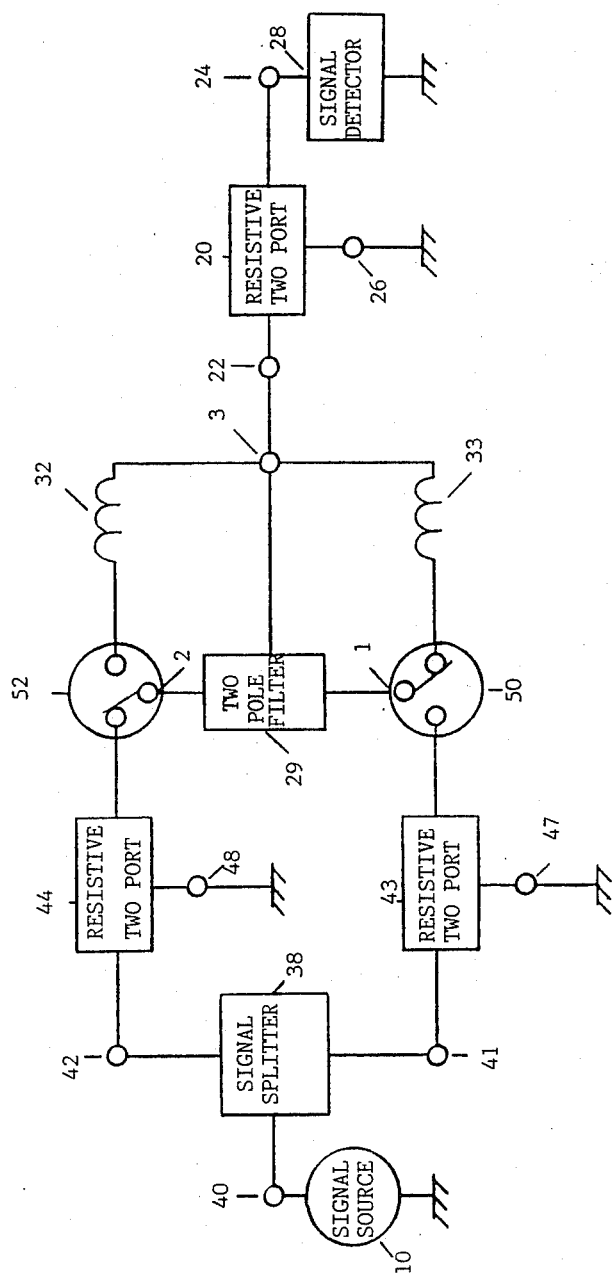
FIG. 7 shows a modification of the circuit of FIG. 6.

FIG. 7 shows a modification of the circuit of FIG. 6. It contains most of the elements of the circuit FIG. 6, such as signal source 10, zero-degree signal splitter 38, resistive twoport networks 20, 43 and 44, twopole 29, inductors 32 and 33, and detector 28. The circuit of FIG. 7 differs from that of FIG. 6 in that switches 30 and 31 of FIG. 6 have been replaced by switches 50 and 52. These switches are connected such that when port 1 of the twopole is connected to the input signal, port 2 is connected to neutralizing inductance 33. Conversely, when port 2 of the twopole is connected to the input signal, port 1 is connected to the neutralizing inductance 32. In this manner, the measurement of F1 and F2 cannot be affected by neutralizing circuits shunting the inputs. The circuit allows the measurement of resonator frequencies F1 and F2 by means of alternately connecting filter ports 1 and 2 to an input signal, and the measurement of Fs through simultaneously connecting both filter ports to both input signals.

While there have been described what are at present considered to be the preferred embodiments of this invention, it will be obvious to those skilled in the art that various changes and modifications may be made therein without departing from the invention, and it is aimed, therefore, in the appended claims to cover all such changes and modifications as fall within the true spirit and scope of the invention.

I claim:

1. A method for fine tuning a center frequency and a bandwidth of a monolithic filter by means of adjusting only three characteristic frequencies of the filter, said three frequencies including the symmetric frquency and two resonator frequencies, and said method comprising the steps of:

(a) selectively applying two balanced signals to first and second filter ports of the crystal filter for selectively exciting each of said three characteristic frequencies;

(b) monitoring each excited characteristic frequency; and (c) adjusting a mass distribution of the crystal filter during the monitoring step such that the characteristic frequencies are adjusted substantially to preselected values.

2. The method as set forth in claim 1 wherein the step of selectively applying two balanced signals comprises:
   (a) applying the first of two balanced signals only to the first of the filter ports to excite a first of the resonator frequencies;
   (b) applying a second of the two balanced signals only to the second of the filter ports to excite a second of the resonator frequencies; and
   (c) applying the first and second balanced signals simultaneously to the first and second filter ports, respectively, to excite the symmetric frequency.

3. An apparatus for fine tuning a center frequency and a bandwidth of a monolithic filter by means of adjusting only three characteristic frequencies of the filter, said three frequencies including the symmetric frequency and two resonator frequencies, and said apparatus comprising:
   (a) means for selectively applying two balanced signals to first and second filter ports of the crystal filter for selectively exciting each of said three characteristic frequencies;
   (b) means for monitoring each excited characteristic frequency;
   (c) means for adjusting a mass distribution of the crystal filter characteristic frquencies are adjusted substantially to preselected values.

4. The apparatus as set forth in claim 3, wherein the means for selectively applying two balanced signals comprise:
   (a) means for applying the first of two balanced signals only to the first of the filter ports to excite a first of the resonator frequencies;
   (b) means for applying a second of the two balanced signals only to the second of the filter ports to excite a second of the resonator frequencies;
   (c) means for applying the first and second balanced signals simultaneously to the first and second filter ports, respectively, to excite the symmetric frequency.

* * * * *